United States Patent [19]

Kawasaki

[11] Patent Number: 5,150,389
[45] Date of Patent: Sep. 22, 1992

[54] SHIFT REGISTER

[75] Inventor: Soichi Kawasaki, Tokyo, Japan

[73] Assignee: Kabushiki Kaisha Toshiba, Kawasaki, Japan

[21] Appl. No.: 645,403

[22] Filed: Jan. 24, 1991

[30] Foreign Application Priority Data

Jan. 26, 1990 [JP] Japan ................................. 2-17303

[51] Int. Cl.$^5$ ............................................ G11C 19/00
[52] U.S. Cl. ........................................ 377/67; 377/72; 377/73; 377/78; 377/81
[58] Field of Search ........................ 377/67, 72, 73, 64, 377/75, 76, 78, 80, 81, 70, 77, 79

[56] References Cited

U.S. PATENT DOCUMENTS 4,340,857  7/1982  Fasang ............................... 324/73 R
4,698,830  10/1987  Barzilai et al. ......................... 377/81
4,837,790  6/1989  Harada ................................. 377/81

OTHER PUBLICATIONS

"Design of Testable Logic Circuits" dated 1984 by R. G. Bennetts, Addison-Wesley Publishing.

Primary Examiner—Stanley D. Miller
Assistant Examiner—Sinh Tran
Attorney, Agent, or Firm—Finnegan, Henderson, Farabow, Garrett and Dunner

[57] ABSTRACT

The input nodes and output nodes of a plurality of storing circuits for storing plural-bit data are connected to one another to constitute a shift register. Each of the plurality of storing circuits includes a selection circuit for selecting 1-bit data from the plural-bit data according to a selection signal, a first latch circuit for latching the 1-bit data selected by the selection circuit in synchronism with a first clock signal, and a number of second latch circuits, which number corresponds to the number of bits of input data, for latching an output of the first latch circuit in synchronism with a plurality of second clock signals having phases different from that of the first clock signal. Data sequentially selected by the selection circuit is latched into the first latch circuit and then sequentially latched into the second latch circuit in a time-sharing fashion.

14 Claims, 6 Drawing Sheets

SHIFT REGISTER

BACKGROUND THE INVENTION

1. Field of the Invention

This invention relates to a shift register for shifting a plurality of bit signals (data) in parallel, and is particularly suitable for a linear feedback shift register used in a circuit for test contained in an LSI.

2. Description of the Related Art

As the integration density of the LSI (large scale integrated circuit) becomes higher and the number of functions thereof becomes larger, the logical test for the input and output of a signal in the LSI becomes more complicated and an amount of data required becomes larger. Therefore, a circuit for test is contained in the recent LSI to reduce an amount of data required for the logical test and test time to minimum.

In the circuit for test, a linear feedback shift register (LFSR) is used for pseudo random data generation or data compression. The LFSR is described in U.S. Pat. No. 4,340,857 "DEVICE FOR TESTING DIGITAL CIRCUITS USING BUILT-IN LOGIC BLOCK OBSERVERS (BILBO'S)" Fasang Jul. 20, 1982 and "DESIGN OF TESTABLE LOGIC CIRCUITS" R. G. BENNETTS ADDISON-WESLEY PUBLISHING COMPANY pp. 62–79, for example. The LFSR is basically constructed by a plurality of latch circuits each formed of a flip-flop circuit, first control gate circuits respectively connected between the plurality of latch circuits and a second control gate circuit for feeding back an output data signal of the last-stage latch circuit to the input node of the first-stage latch circuit. The latch circuits are supplied with a clock signal and the first control gate circuits are respectively supplied with data signals. The data signals are received in synchronism with the clock signals supplied to the respective latch circuits and then sequentially shifted. An output data signal output from each of the output nodes of the latch circuits is supplied to the succeeding-stage latch circuit and derived from each of the latch circuits. An output data signal from the last-stage latch circuit and output data signals from the intermediate-stage latch circuits are supplied to the second control gate circuit for logical operation and then fed back to the input node of the first-stage latch circuit so as to be used as a data signal in the next cycle. The circuit construction of the second control gate circuit and the latch circuit from which it derives data are determined according to the data shift pattern.

In a case where the above LFSR is used for pseudo random data generation, initial values are set into the respective latch circuits by data signals input to the first control gate circuits, the data signals are set to a logical value "0" and then the data in each of the latch circuits is sequentially shifted so that pseudo random data required for the test can be derived from the output node of each of the latch circuits. The output data signal generated as pseudo random data is supplied to the internal portion of the LSI to be tested and the test result is output from the external output terminals of the LSI. On the other hand, in a case where the LFSR is used for data compression, a desired signal to be compressed is supplied as a data signal to the first control gate circuits. The data signal received by each of the latch circuits is sequentially shifted in each of the latch circuits in synchronism with the clock signal and is compressed. As a result, an amount of data necessary for a logical test can be reduced, thus simplifying the test.

It is necessary for the LFSR to have stages of a number corresponding to the number of the input signals necessary for the test when it is used for pseudo random data generation and stages of a number corresponding to the number of the output signals to be observed when it is used for data compression. When the input signal number and output signal number are large in the logical test of the LSI, more precise test result can be generally obtained. Even when a design for testability by dividing the logic circuit into a plurality of logic blocks is used, the input signal number and output signal number will become larger in the divided logic blocks as a whole. Therefore, as the integration density of the LSI becomes larger, the number of stages of the LFSR necessary for the test becomes larger, thereby increasing the occupied area and preventing the LSI from being formed at a high integration density.

SUMMARY OF THE INVENTION

Accordingly, an object of this invention is to provide a shift register whose occupied area can be reduced so as to permit the integration density of an LSI to be enhanced.

The above object can be attained by a shift register comprising a plurality of storing circuits which latch data having a plurality of bits in a time-sharing fashion and are connected such that an output of one of the storing circuits can be used as an input signal of the succeeding-stage storing circuit and each of which includes a selection circuit for selecting one bit from input data having a plurality of bits according to a selection signal; a first latch circuit for latching a 1-bit signal selected by the selection circuit; and a number of second latch circuits, which number corresponds to the number of bits of the input signal, for latching an output of the first latch circuit in a timesharing fashion.

In the shift register of the above construction, the input signal selected by the selection circuit is sequentially stored into the second latch circuit in a time-sharing fashion by commonly using the first latch circuit. As a result, one of the storing units necessary for the 1-bit shifting circuit can be formed of the first latch circuit of one bit. That is, the same function as in the conventional case can be attained by use of (n+1) storing units in total by commonly using the first latch circuit in a time-sharing fashion when n-bit data is shifted in parallel. Therefore, the necessary circuit scale can be reduced to substantially half that of the conventional case as n becomes larger.

Thus, a shift register whose occupied area is reduced so as to permit the integration density of the LSI to be enhanced can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above

3 and the detailed description of the preferred embodiments given below, serve to explain the principles of the invention.

Figure 1:
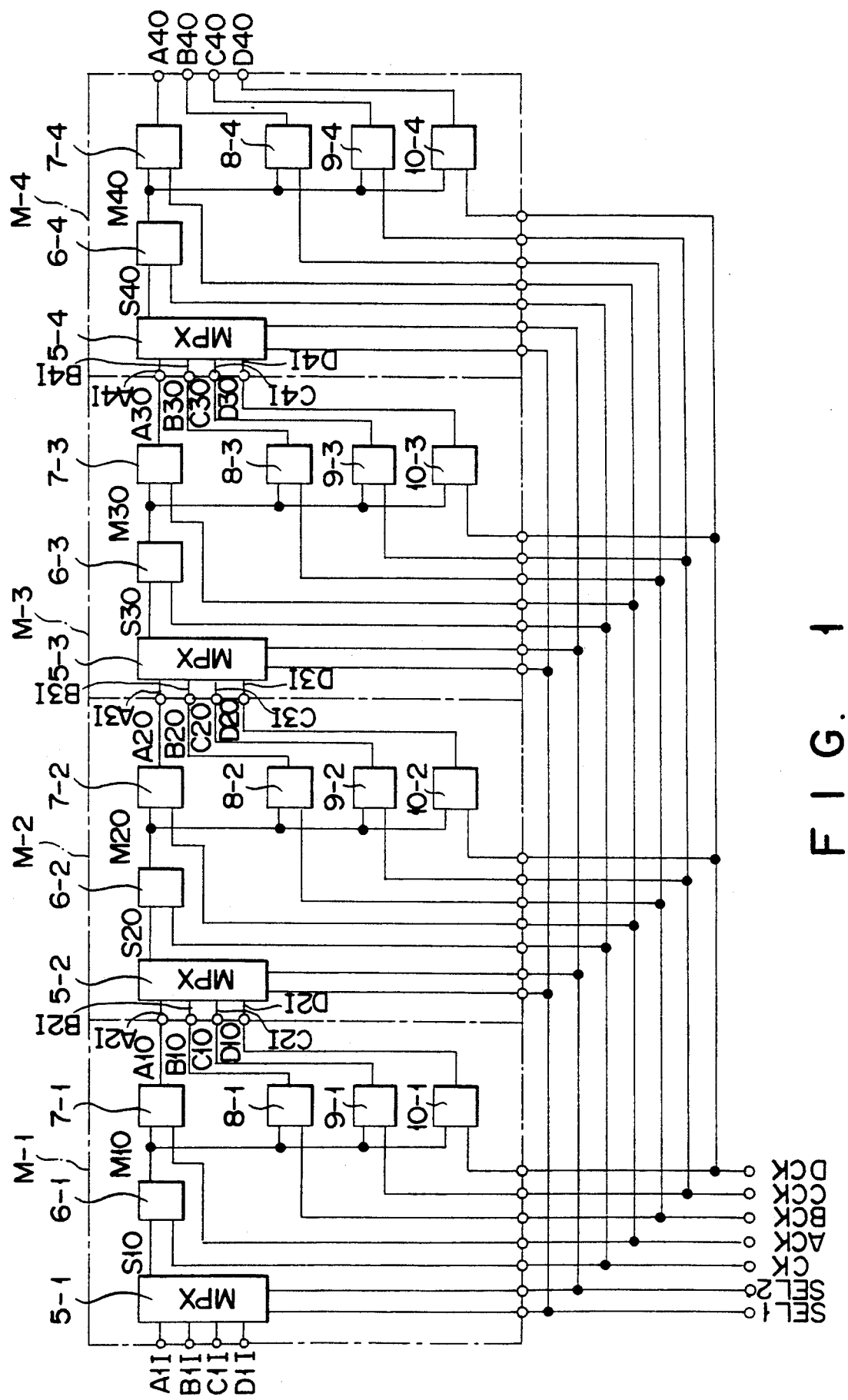
Figure 2:
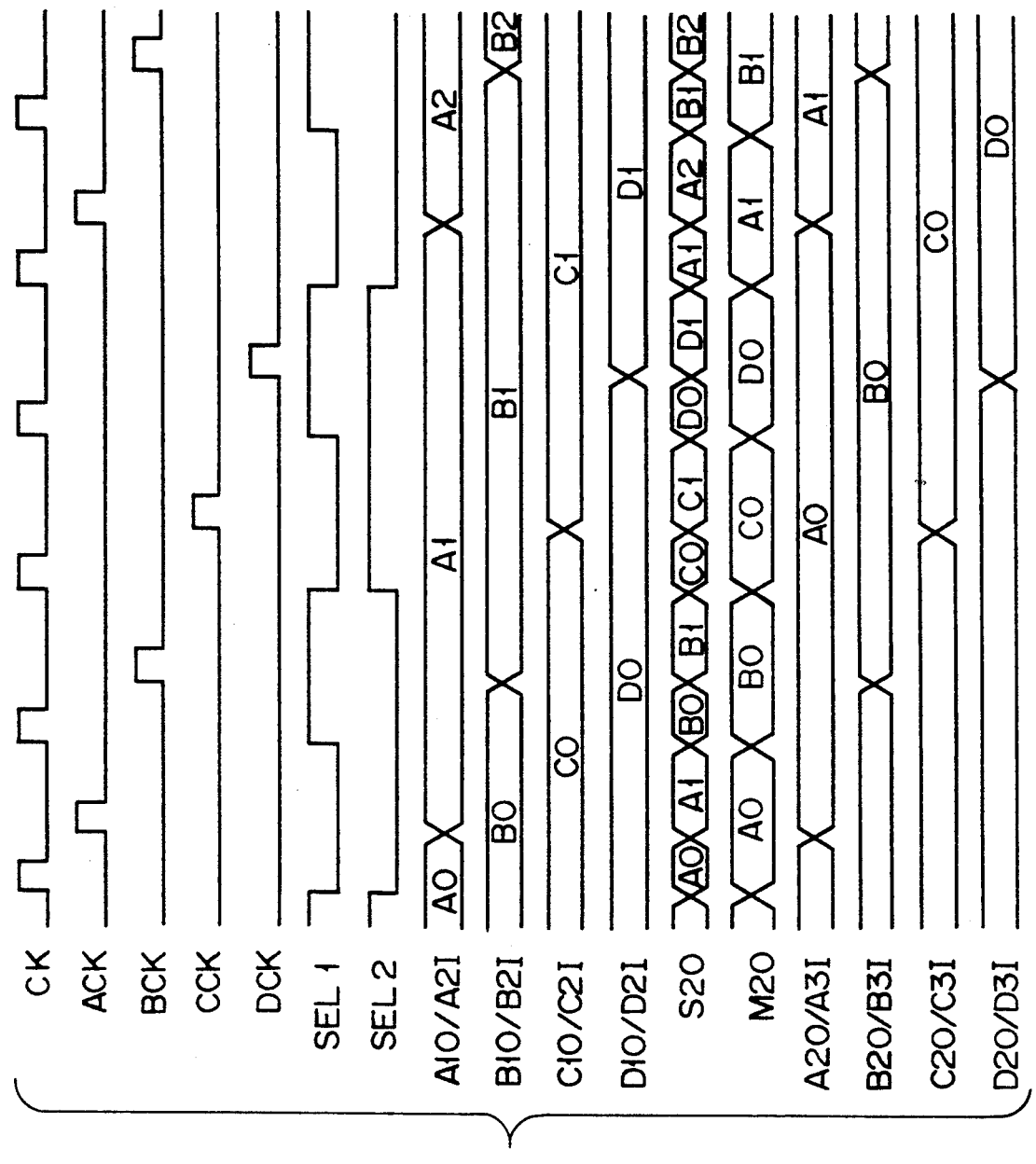
Figure 3:
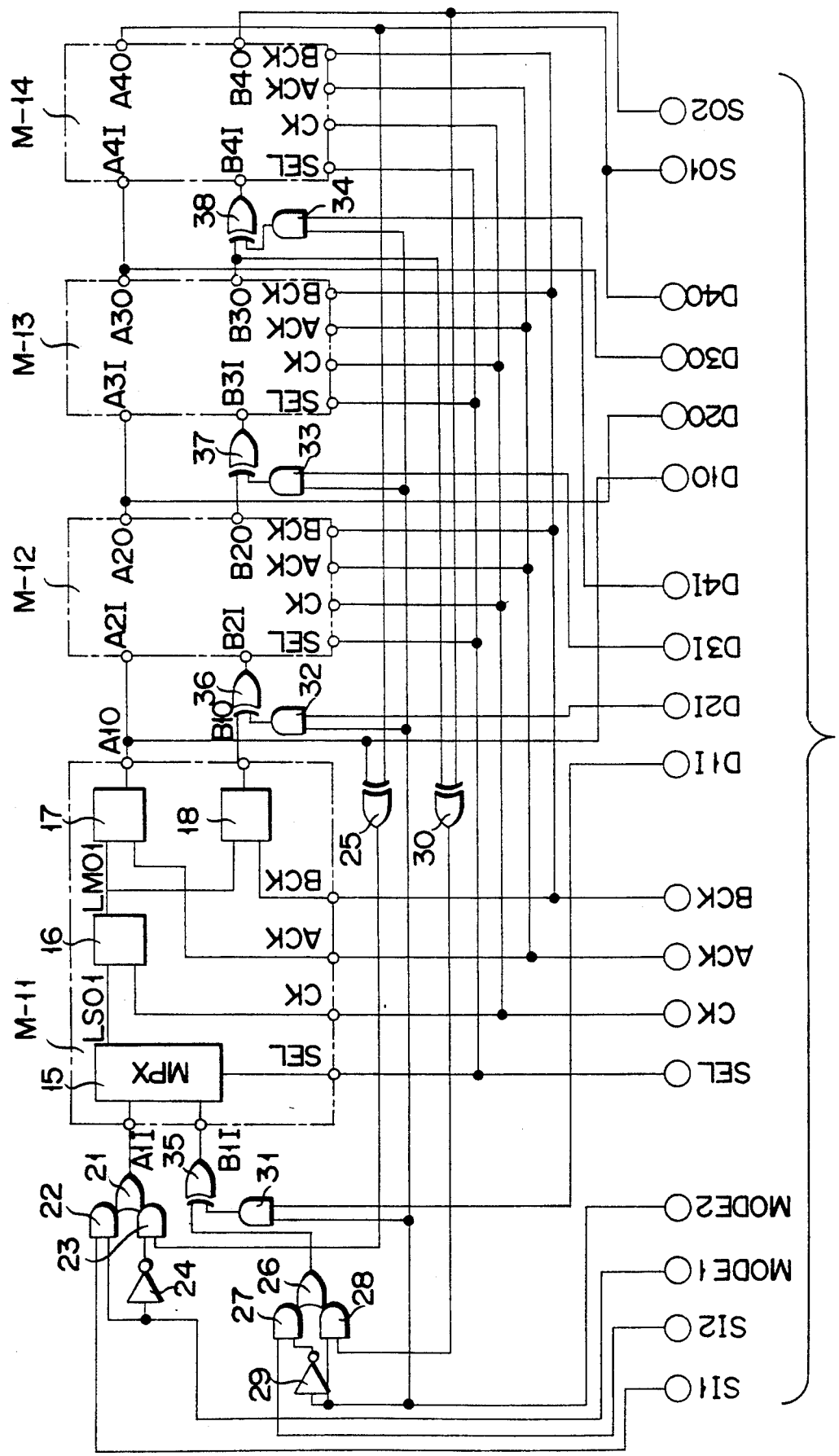
Figure 4:
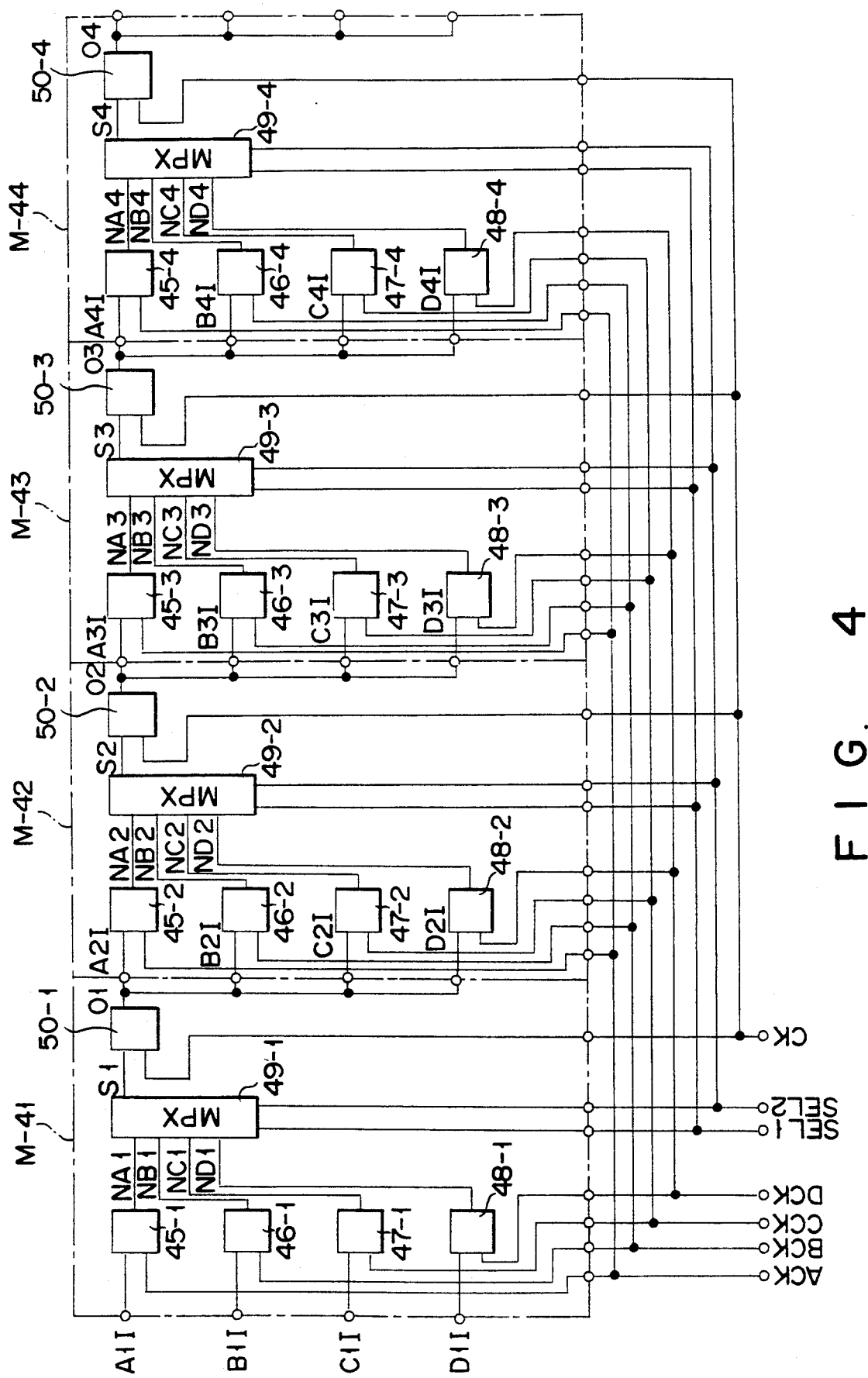
Figure 5:
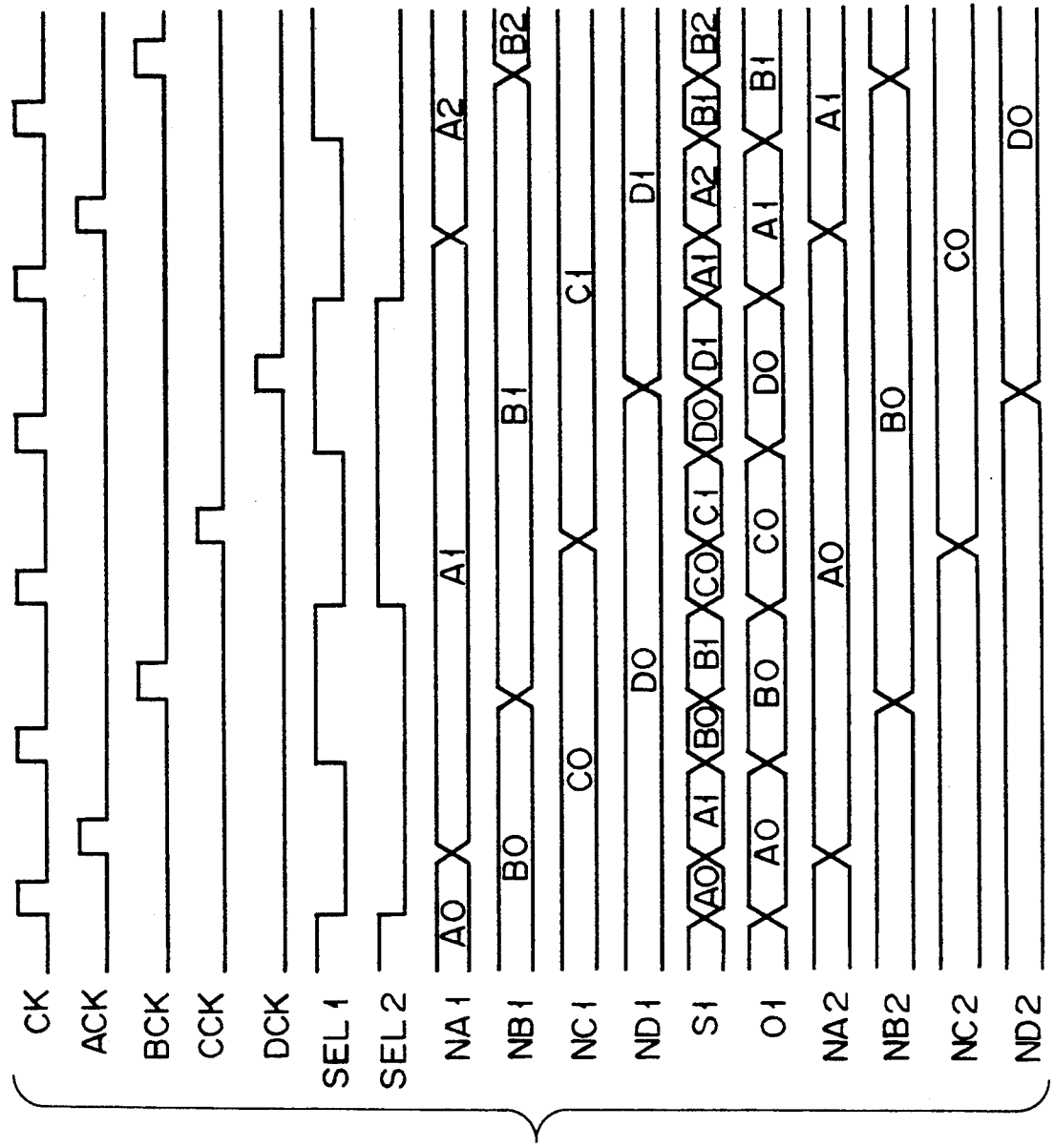
Figure 6:
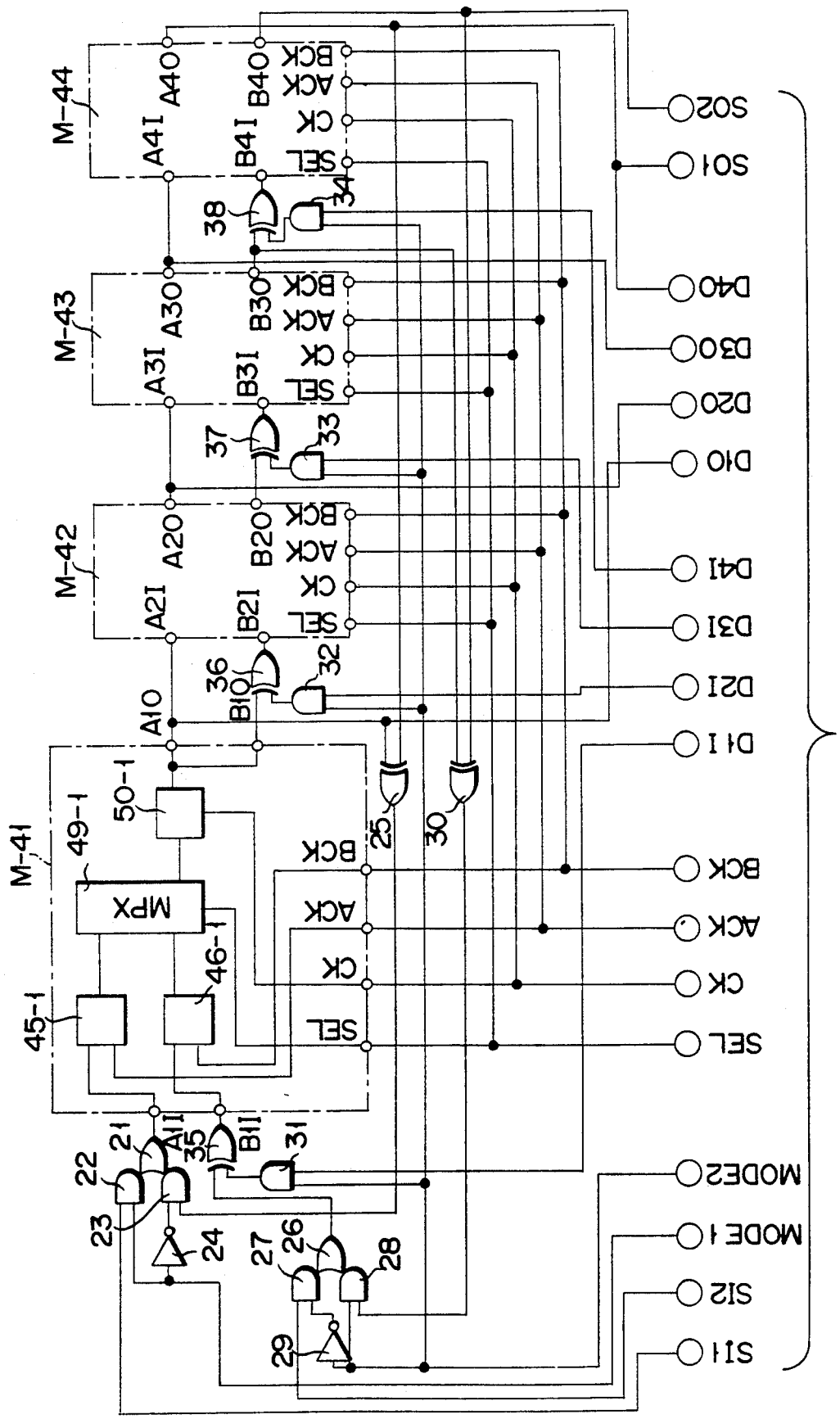

FIG. 1 is a circuit diagram showing a shift register according to a first embodiment of this invention;

FIG. 2 is a timing chart for explaining the operation of the shift register shown in FIG. 1;

FIG. 3 is a circuit diagram of a linear feedback shift register constructed by using the shift register shown in FIG. 2;

FIG. 4 is a circuit diagram showing a shift register according to a second embodiment of this invention;

FIG. 5 is a timing chart for explaining the operation of the shift register shown in FIG. 4; and FIG. 6 is a circuit diagram of a linear feedback shift register constructed by using the shift register shown in FIG. 4.

DETAILED DESCRIPTION OF THE PREFERRED EMBODIMENTS

FIG. 1 is a circuit diagram showing a shift register according to a first embodiment of this invention and the shift register is constructed to shift 4-bit data in parallel. 4-bit storing circuits M-1, M-2, M-3 and M-4 respectively include multiplexers (MPX) 5-1 to 5-4, 1-bit latch circuits 6-1 to 6-4, and four 1-bit latch circuits 7-1 to 7-4, 8-1 to 8-4, 9-1 to 9-4 and 10-1 to 10-4. The storing circuits M-1, M-2, M-3 and M-4 are supplied with 2-bit selection signals SEL1 and SEL2, clock signal CK, and clock signals ACK, BCK, CCK and DCK. 4-bit input signals A1I, B1I, C1I and D1I input to the storing circuit M-1 are sequentially shifted to the storing circuits M-2 to M-4 and output from the storing circuit M-4 as output signals A40, B40, C40 and D40 according to control by the selection signals SEL1 and SEL2, clock signal CK, and clock signals ACK, BCK, CCK and DCK.

The multiplexer 5-1 of the first-stage storing circuit M-1 selects one of the input signals A1I, B1I, C1I and D1I which are 4-bit parallel data according to the 2-bit selection signals SEL1 and SEL2 and outputs the same as an output signal S10. The latch circuit 6-1 latches the signal S10 output from the multiplexer 5-1 at the time of rise (or fall) of the clock signal CK. The clock signal CK and the selection signals SEL1 and SEL2 are generated in synchronism with each other. The latch circuits 7-1 to 10-1 are supplied with an output signal M10 of the latch circuit 6-1. The latch circuit 7-1 to 10-1 latch the output signal M10 in synchronism with the clock signal CK and four clock signals ACK, BCK, CCK and DCK having different phases in a time-sharing fashion.

The storing circuits M-2, M-3 and M-4 are cascade-connected so that outputs of the four latch circuits 7 to 10 in the preceding-stage storing circuit M can be supplied to the multiplexer 5 in the succeeding stage storing circuit M. That is, output signals A10, B10, C10 and D10 of the latch circuits 7-1, 8-1, 9-1 and 10-1 in the storing circuit M-1 are supplied as input signals A2I, B2I, C2I and D2I to the multiplexer 5-2 in the storing circuit M-2, output signals A20, B20, C20 and D20 of the latch circuits 7-2, 8-2, 9-2 and 10-2 in the storing circuit M-2 are supplied as input signals A3I, B3I, C3I and D3I to the multiplexer 5-3 in the storing circuit M-3. Further, output signals A30, B30, C30 and D30 of the latch circuits 7-3, 8-3, 9-3 and 10-3 in the storing circuit M-3 are supplied as input signals A4I, B4I, C4I and D4I to the multiplexer 5-4 in the storing circuit M-4. The output signals of the latch circuits 7-4, 8-4, 9-4

4 and 10-4 in the storing circuit M-4 are supplied as output signals A40, B40, C40 and D40.

Next, the operation of the circuit shown in FIG. 1 is explained with reference to the timing chart shown in FIG. 2. The timing chart is drawn in view of the input-/output relation of signals in the storing circuit M-2 in the circuit of FIG. 1.

First, when the selection signals SEL1 and SEL2 are both at "0" level, the selection circuit 5-2 of the storing circuit M-2 selects the input signal A2I which is the output signal A10 of the preceding-stage storing circuit M-1, that is, data A0 in the timing chart. As a result, the data A0 is transferred as an output signal S20 of the selection circuit 5-2. At this time, if the clock signal CK supplied to the latch circuit 6-2 is changed from "0" level to "1" level, the data A0 is latched in the latch circuit 6-2 and the output signal M20 thereof becomes A0. Next, when the clock signal ACK to the latch circuit 7-2 is changed from "0" level to "1" level, the data A0 is latched in the latch circuit 7-2 and the output signal A20 thereof becomes A0.

The shifting operation for the outputs A10, A20, A30 and A40 of the four storing circuits M-1, M-2, M-3 and M-4 is completed by effecting a sequence of the above-described operations. In this operation, the output A10 of the storing circuit M-1 is changed in the same manner as the output A20 and it is changed from data A0 to data A1. Then, the output signal S20 of the selection circuit 5-2 is changed from data A0 to data A1.

Next, the selection signals SEL1 and SEL2 are respectively set to "1" and "0" levels and the same operation as described above is effected. That is, the selection circuit 5-2 selects the input signal B2I which is the output signal B10 of the latch circuit 8-1 in the preceding-stage storing circuit M-1, that is, data B0 in the timing chart. As a result, the data B0 is transferred as the output signal S20 of the selection circuit 5-2. At this time, if the clock signal CK supplied to the latch circuit 6-2 is changed from "0" level to "1" level, the data B0 is stored into the latch circuit 6-2 and the output signal M20 thereof becomes B0. Next, when the clock signal BCK to the latch circuit 7-2 is changed from "0" level to "1" level, the data B0 is stored into the latch circuit 7-2 and the output signal B20 thereof becomes B0.

The shifting operation for the outputs B10, B20, B30 and B40 of the storing circuits M-1, M-2, M-3 and M-4 is completed by effecting a sequence of the above-described operations.

Next, the shifting operation with respect to the outputs C10, C20, C30 and C40 can be effected by respectively setting the selection signals SEL1 and SEL2 to "0" and "1" levels and effecting the same operation as described above. The shifting operation for the outputs D10, D20, D30 and D40 can be effected by setting both of the selection signals SEL1 and SEL2 to "1" level and effecting the same operation as described above.

As described above, the parallel shifting operation of one cycle for the 4-bit input signals A1I, B1I, C1I and D1I is completed by respectively setting the levels of the selection signals SEL1 and SEL2 to "0" and "0"; "1" and "0"; "0" and "1"; and "1" and "1".

Likewise, the parallel shifting operation for the next 4-bit input signal is effected by changing the levels of the selection signals SEL1 and SEL2.

With the above construction, since each of the latch circuits 6 of the storing circuits M-1, M-2, M-3 and M-4 is commonly used by the latch circuits 7 to 10 in a time-sharing fashion, the necessary pattern area can be reduced. That is, in a case where 4-bit data is shifted in a parallel manner, two storing units (latch circuits) for each bit and eight storing units in total for four bits are required in the storing circuit of the conventional shift register, but in this invention, a 4-bit storing circuit can be constructed by use of five latch circuits and one selection circuit (multiplexer).

Further, since the shifting operation for the input signals A1I, B1I, C1I and D1I can be effected by selectively setting one of the four states of the selection signals SEL1 and SEL2 and a combination of the clock signals CK, ACK, BCK, CCK and DCK, a shifting path for which the shifting operation is not required can be selectively omitted by removing the combination of the clock signals required for the transfer or omitting a corresponding one of the states of the selection signals SEL1 and SEL2. Further, in the circuit of FIG. 1, the selection signals SEL1 and SEL2 are commonly used for each storing circuit, but if they are set separately for the respective storing circuits, various shifting paths including A10, B20, C30 and D40, for example, can be attained in addition to the shifting paths of A10, A20, A30 and A40 and B10, B20, B30 and B40, ---. The same data can be simultaneously shifted by independently controlling the clock signals CK, ACK, BCK, CCK and DCK for the respective storing circuits M-1, M-2, M-3 and M-4. Thus, the shifting operation can be freely changed as required.

FIG. 3 is a circuit diagram showing an example of application of a preferred embodiment of this invention and shows the construction of the 4-stage linear feedback shift register (LFSR) constructed by use of the shift register shown in FIG. 1. The LFSR effects the pseudo random data generation and data compression and includes storing circuits M-11, M-12, M-13 and M-14 for shifting 2-bit input signals S11 and S12. As shown by the storing circuit M-11, for example, each of the storing circuits M-11, M-12, M-13 and M-14 includes a selection circuit 15, 1-bit latch circuit 16 for latching an output of the selection circuit, and 1-bit output-stage latch circuits 17 and 18. The mode switching operation is effected by control gate circuits arranged around the storing circuits M-11, M-12, M-13 and M-14. 4-bit parallel pseudo random data is generated by the shifting operation in the shifting path of A10, A20, A30 and A40 and 4-bit parallel data is compressed by the shifting operation in the shifting path of B10, B20, B30 and B40.

The control gate circuits constitute a control gate section, which comprises a pseudo random data generating unit and a data compressing unit. The data generating units includes the shifting paths A10, A20, A30 and A40, and the data compressing unit includes the shifting paths B10, B20, B30 and B40. These units will be described in detail.

As OR gate 21, AND gates 22 and 23, and an inverter 24 which constitute the control gate circuit of the pseudo random data generator control the operation mode to determine whether the operation mode is set to a mode in which the shifting operation in the path of A10, A20, A30 and A40 is effected or an LFSR mode in which 4-bit parallel pseudo random data is generated. An EXOR (exclusive-OR) gate 25 is a feedback gate for constituting an LFSR in the shifting path of A10, A20, A30 and A40 and an output thereof is supplied to one of the input terminals of the AND gate 23.

When a control input signal MODE1 supplied from the exterior is set at "0" level, the shifting path of A10, A20, A30 and A40 is set into the LFSR mode and an output of the EXOR gate 25 is transferred as an input signal A1I to one of the input terminals of the multiplexer 15-1. At this time, 4-bit parallel pseudo random data is supplied to the path of A10, A20, A30 and A40 in each shifting period of one cycle and output as output signals D10, D20, D30 and D40 from the respective output terminals.

Next, when the signal MODE1 is set at "1" level, the path of A10, A20, A30 and A40 is set into the shifting mode, an input signal SI1 is transferred to A1I, and shift data is obtained in A40 in each shifting period of one cycle and output as an output signal SO1.

On the other hand, an OR gate 26, AND gates 27 and 28, and an inverter 29 which constitute the data compressor control the operation mode according to an externally supplied control input signal MODE2 to determine whether the operation mode is set to a mode in which the shifting operation in the path of B10, B20, B30 and B40 is effected or an LFSR mode in which 4-bit input parallel data D10, D20, D30 and D40 is compressed. An EXOR gate 30 is a feedback gate for constituting an LFSR in the shifting path of B10, B20, B30 and B40 and an output thereof is supplied to one of the input terminals of the AND gate 28. AND gates 31, 32, 33 and 34 supply 4-bit parallel data of externally supplied input data signals D1I, D2I, D3I and D4I via EXOR gates 35, 36, 37 and 38 as input signals B1I, B2I, B3I and B4I of the storing circuits M-11, M-12, M-13 and M-14. The other input terminals of the EXOR gates 35, 36, 37 and 38 are respectively supplied with an output signal of the OR gate 26, and output signals B10, B20 and B30 of the storing circuits M-11, M12 and M-13.

When the control input signal MODE2 is set at "1" level, the shifting path of B10, B20, B30 and B40 is set into the LFSR mode and an output signal of the EXOR gate 30 is transferred to one of the input terminals of the EXOR 35 via the AND gate 28 and OR gate 26. At this time, the data signal D1I is supplied to the storing circuit M-11 via the AND gate 31 and EXOR gate 35 and compressed therein. Likewise, the data signal D2I is supplied to the storing circuit M-12 via the AND gate 32 and EXOR gate 36 and compressed therein. Likewise, the data signals D3I and D4I are compressed in the storing circuits M-13 and M-14 in the same manner as described above.

Next, when the signal MODE2 is set at "0" level, the path of B10, B20, B30 and B40 is set into the shifting mode. At this time, since output signals of the AND gates 31, 32, 33 and 34 are set at "0" level, the EXOR gate 35 transfers the input signal S12 to B1I, the EXOR gate 36 transfers B10 to B2I, the EXOR gate 37 transfers B20 to B3I, and the EXOR gate 38 transfers B30 to B4I. B40 is output as an output signal SO2.

In general, as described above, when the LFSR is used for data compression, the shifting mode is initially set and storing data of each storing circuit is initialized, and then the LFSR mode is set to effect the data compression, and the shifting mode is set again to shift the result of compression and the compression result is output from the last stage and monitored. In the circuit of FIG. 3, generation of a 4-bit pseudo random data and compression of 4-bit parallel data can be simultaneously attained.

FIG. 4 is a circuit diagram showing a shift register according to a second embodiment of this invention. The basic constituting elements of this circuit are the same as those of the circuit shown in FIG. 1. That is, in the circuit of FIG. 1, one bit of an input signal having a plurality of bits is selected by the selection circuit and latched into the first latch circuit and then an output of the first latch circuit is latched into the second latch circuits of a number corresponding to the number of bits of the input signal in a time-sharing fashion. In contrast, in the circuit of FIG. 4, an input signal having a plurality of bits is latched into the first latch circuits of a number corresponding to the number of bits of the input signal and then an output signal of one of the first latch circuits is selected by the selection circuit and an output of the selected first latch circuit is supplied to and latched into the second latch circuit in a time-sharing fashion.

4-bit storing circuits M-41, M-42, M-43 and M-44 are constituted by 1-bit latch circuits 45-1 to 45-4, 46-1 to 46-4, 47-1 to 47-4, and 48-1 to 48-4, selection circuits 49-1 to 49-4 each of which may be a multiplexer for selecting a latched output of a corresponding one of the latch circuits, and 1-bit latch circuits 50-1 to 50-4 for latching the outputs of the selection circuits 49-1 to 49-4 in a time-sharing fashion. 4-bit input signals A1I, B1I, C1I and D1I are input to and latched into the latch circuits 45-1 to 48-1 in response to clock signals ACK, BCK, CCK and DCK of different phases. One bit of each of latched outputs NA1, NB1, NC1 and ND1 of the 4-bit input signals A1I, B1I, C1I and D1I latched in the latch circuits 45-1 to 48-1 is selected and output as an output signal S1 by controlling the selection circuit 49-1 according to the selection signals SEL1 and SEL2. The output S1 of the selection circuit 49-1 is latched into the 1-bit latch circuit 50-1 in synchronism with the rise (or fall of the clock signal CK. The clock signal CK and the selection signals SEL1 and SEL2 are generated in synchronism with each other. The selected 1-bit signal is sequentially transferred to the latch circuit 50-1 in a time-sharing fashion.

The storing circuits M-42, M-43 and M-44 are constructed in the same manner as the storing circuit M-41, and an output signal 01 of the latch circuit 50-1 in the storing circuit M-41 is commonly supplied as 4-bit input signals A2I, B2I, C2I and D2I in the storing circuit M-42 and latched into the latch circuits 45-2, 46-2, 47-2 and 48-2 in synchronism with the clock signals ACK, BCK, CCK and DCK in a time-sharing fashion. Likewise, data latched into the latch circuits 45-2, 46-2, 47-2 and 48-2 in the same manner as described above is sequentially supplied to the next stage.

The operation of the circuit shown in FIG. 4 is illustrated in the timing chart of FIG. 5. As shown in FIG. 5, the operation of the circuit according to the second embodiment is basically the same as that of the circuit according to the first embodiment. However, with the circuit construction of FIG. 4, a function of shifting 4-bit parallel data can be provided, but care must be taken for the timing control of respective clock signals at the time of data output since data is output in a time-sharing fashion.

With the above construction, since each of the latch circuits 50 of the storing circuits M-41, M-42, M-43 and M-44 are commonly used by the latch circuits 45, 46, 47 and 48 in a time-sharing fashion in the same manner as in the circuit of the first embodiment, the number of latch circuits used can be reduced and the pattern area thereof can be reduced.

It is also possible to constitute a linear feedback shift register (LFSR) which is formed as shown in FIG. 6 to effect pseudo random data generation and data compression in the same manner as the shift register shown in FIG. 1 by using the shift register shown in FIG. 4. The LFSR shown in FIG. 6 is basically the same as the LFSR shown in FIG. 3 except that the storing circuits M-41, M-42, M-43 and M-44 shown in FIG. 4 are used instead of the storing circuits M-11, M-12, M-13 and M-14 shown in FIG. 3, and the same portions are denoted by the same reference numerals and detailed explanation therefor is omitted.

Additional advantages and modifications will readily occur to those skilled in the art. Therefore, the invention in its broader aspects is not limited to the specific details, representative devices, shown and described herein. Accordingly, various modifications may be made without departing from the spirit or scope of the general inventive concept as defined by the appended claims and their equivalents.

As described above, according to the preferred embodiment of this invention, one of the two storing units necessary for the 1-bit shift circuit can be commonly used in a time-sharing fashion in the parallel data shifting operation. As a result, the number of latch circuits may be reduced to substantially half that of the latch circuits used in the conventional case in a large scale circuit. Further, not only one path but also a large number of paths may be freely selected in the data shifting operation by independently controlling the selection signals for each of the storing circuits and the clock signals.

What is claimed is:

1. A shift register comprising:
   a plurality of storing means each of which stores data having a plurality of bits and which are cascade-connected so that an output of one of said storing means is applied as an input of a succeeding-stage storing means,
   wherein said plurality of storing means each includes selection means for selecting one bit from an input data having a number of bits according to a selection signal; first latch means for latching the bit selected by said selection means; and a plurality of second latch means which number corresponds to the number of bits, for latching an output of said first latch means in a time-sharing fashion.

2. A shift register according to claim 1, wherein said selection means includes a multiplexer.

3. A shift register according to claim 1, wherein said first latch means includes means for latching 1-bit data selected by said selection means in synchronism with a first clock signal.

4. A shift register according to claim 3, wherein said plurality of second latch means includes means for latching plural-bit data in synchronism with a plurality of second clock signals having phases different from that of the first clock signal in a time-sharing fashion.

5. A shift register according to claim 1, further comprising first control gate means for receiving an output signal of a preceding-stage storing means and an exterior data signal and effecting a logical operation to apply the result of the logical operation to a succeeding stage storing means, and second control gate means for effecting a logical operation for an output of the last-stage storing means and an output signal of an intermediate-stage storing means and feeding back the result of the logical operation to an input node of a first-gate storage storing means.

6. A shift register according to claim 5, wherein said first control gate means includes an exclusive-OR gate for receiving an output signal of the preceding-stage storing means at a first input and the data signal at a second input, and for applying an output to the succeeding-stage storing means.

7. A shift register according to claim 5, wherein said second control gate means includes an exclusive-OR gate for receiving an output signal of the last-stage storing means at a first input and an output signal of the intermediate-stage storing means at a second input, and for applying an output to the first-stage storing means.

8. A shift register comprising:
a plurality of storing means each of which stores data having a plurality of bits and which are cascade-connected so that an output of one of said storing means is applied as an input of a succeeding-stage storing means,
wherein said plurality of storing means each includes first latch means having a number of bits corresponding to a number of bits of an input data, for latching the input data in a time-sharing fashion; selection means for selecting one of the bits latched in said first latch means according to a selection signal; and second latch means for latching the bit selected by said selection means.

9. A shift register according to claim 8, wherein said selection means includes a multiplexer.

10. A shift register according to claim 8, wherein said second latch means includes means for latching the bit selected by said selection means in synchronism with a first clock signal.

11. A shift register according to claim 10, wherein said first latch means includes means for latching plural-bit data in synchronism with a plurality of second clock signals having phases different from that of the first clock signal in a time-sharing fashion.

12. A shift register according to claim 8, further comprising first control gate means for receiving an output signal of a preceding-stage storing means and an exterior data signal and effecting a logical operation to apply the result of the logical operation to a succeeding-stage storing means, and second control gate means for effecting a logical operation for an output of the last-stage storing means and an output signal of an intermediate-stage storing means and feeding back the result of the logical operation to an input node of a first-gate storing means.

13. A shift register according to claim 12, wherein said first control gate means includes an exclusive-OR gate for receiving an output signal of the preceding-stage storing means at a first input and the data signal at a second input, and for applying an output to the succeeding-stage storing means.

14. A shift register according to claim 13, wherein said second control gate means includes an exclusive-OR gate for receiving an output signal of the last-stage storing means at a first input and an output signal of the intermediate-stage storing means at a second input, and for applying an output to the first-stage storing means.

* * * * *

UNITED STATES PATENT AND TRADEMARK OFFICE
CERTIFICATE OF CORRECTION

PATENT NO.   : 5,150,389
DATED        : September 22, 1992
INVENTOR(S)  : Soichi Kawasaki It is certified that error appears in the above-identified patent and that said Letters Patent is hereby corrected as shown below:

Claim 12, column 10, line 12, change "a" to --the--.

Claim 12, column 10, line 18, change "first-gate" to --first-stage--.

Signed and Sealed this

Twenty-sixth Day of October, 1993

Attest:

BRUCE LEHMAN

Attesting Officer

Commissioner of Patents and Trademarks